United States Patent
Noguchi et al.

(10) Patent No.: US 6,436,795 B2
(45) Date of Patent: Aug. 20, 2002

(54) PROCESS FOR PRODUCING SEMICONDUCTOR CHIP

(75) Inventors: Hayato Noguchi, Urawa; Kazuyoshi Ebe, Shiraoka-machi, both of (JP)

(73) Assignee: Lintec Corporation, Tokyo (JP)

( * ) Notice: Subject to any disclaimer, the term of this patent is extended or adjusted under 35 U.S.C. 154(b) by 0 days.

(21) Appl. No.: 09/777,599

(22) Filed: Feb. 6, 2001

(30) Foreign Application Priority Data

Feb. 7, 2000 (JP) ........................................ 2000-028702

(51) Int. Cl.7 .............................................. H01L 21/46
(52) U.S. Cl. ...................................................... 438/460
(58) Field of Search ................................ 438/113, 114, 438/118, 455, 458, 460, 463, 464

(56) References Cited

U.S. PATENT DOCUMENTS

| | | | |
|---|---|---|---|
| 5,705,016 A | * 1/1998 | Senoo et al. | 156/289 |
| 5,714,029 A |   2/1998 | Uemura et al. | |
| 6,007,920 A | * 12/1999 | Umehara et al. | 428/473.5 |
| 6,140,151 A | * 10/2000 | Akram | 438/113 |
| 6,176,966 B1 | * 1/2001 | Tsujimoto et al. | 156/344 |

FOREIGN PATENT DOCUMENTS

| | | |
|---|---|---|
| GB | 2 340 772 A | 3/2000 |
| JP | 60(1985)-196956 | 10/1985 |
| JP | 60(1985)-223139 | 11/1985 |
| JP | 5(1993)-32946 | 2/1993 |
| JP | 8(1996)-27239 | 1/1996 |
| JP | 11(1999)-109806 | 4/1999 |

* cited by examiner

*Primary Examiner*—David Nelms
*Assistant Examiner*—Quoc Hoang
(74) *Attorney, Agent, or Firm*—Webb Ziesenheim Logsdon Orkin & Hanson, P.C.

(57) ABSTRACT

A process for producing semiconductor chips, comprising the following steps. A semiconductor wafer having a surface overlaid with circuits is provided. An arrangement wherein a back of the semiconductor wafer is fixed on a dicing tape and wherein a pressure sensitive adhesive double coated sheet is stuck to a circuit surface of the semiconductor wafer is formed. The pressure sensitive adhesive double coated sheet comprises a shrinkable base having its both sides overlaid with pressure sensitive adhesive layers. At least one of the layers is composed of an energy radiation curable pressure sensitive adhesive. The semiconductor wafer together with the pressure sensitive adhesive double coated sheet is diced by each circuit to thereby form semiconductor chips. The semiconductor chips are fixed on a transparent hard plate by adherence of the pressure sensitive adhesive layer of the pressure sensitive adhesive double coated sheet remote from the semiconductor chips. The dicing tape is stripped from the semiconductor chips. The pressure sensitive adhesive double coated sheet, on its transparent hard plate side, is irradiated with energy radiation. The shrink base of the pressure sensitive adhesive double coated sheet is shrunk, and the semiconductor chips are picked up. In the working of a semiconductor wafer into extremely reduced thickness, semiconductor chips can be produced with high yield without suffering from damaging of semiconductor chips such as chip splitting or cracking.

4 Claims, 2 Drawing Sheets

PROCESS FOR PRODUCING SEMICONDUCTOR CHIP

FIELD OF THE INVENTION

The present invention relates to a process for producing semiconductor chips. More particularly, the present invention relates to a process for producing semiconductor chips with high yield without damaging the semiconductor chips.

BACKGROUND OF THE INVENTION

In recent years, the spread of IC cards has been promoted, and accordingly the reduction of the thickness thereof is increasingly demanded. Thus, it is now needed to reduce the thickness of semiconductor chips from the conventional about 350 μm to 50–100 μm or less.

In the production of the above semiconductor chips, it is common practice to first fix a semiconductor wafer on a pressure sensitive adhesive sheet known as a dicing tape, subsequently perform required processing (dicing, etc.) to thereby form semiconductor chips and thereafter pick up the semiconductor chips while thrusting them up by applying a thrust pin to the back (base side) of the dicing tape. However, the semiconductor chips of reduced thickness are so brittle that they are occasionally damaged by the impact of the thrusting.

The applicant, in Japanese Patent Application No. 11(1999)-109806, has proposed a technique utilizing a pressure sensitive adhesive double coated sheet including a heat shrink base. In this technique, first a semiconductor wafer is fixed on a hard plate by means of the pressure sensitive adhesive double coated sheet, and subsequently required processing is performed to thereby form the semiconductor wafer into semiconductor chips. Thereafter, the pressure sensitive adhesive double coated sheet is heated to thereby effect a heat shrink of the base of the double coated sheet with the result that the pressure sensitive adhesive layer of the double coated sheet is deformed. The deformation of the pressure sensitive adhesive layer reduces the area of contact of the semiconductor chips with the pressure sensitive adhesive layer to thereby result in reduction of adherence. This facilitates the pickup of the semiconductor chips. However, in this process, it is requisite to dice the semiconductor wafer from the back thereof. In the event of chip cracking, it is likely to occur at the circuit surface thereof to thereby invite the danger of lowering the yield of semiconductor chips.

The present invention has been made in view of the above state of the prior art. Thus, it is an object of the present invention to provide a process for producing semiconductor chips with high yield while avoiding the damage to the semiconductor chips, such as chip splitting or cracking, while working a semiconductor wafer having extremely reduced thickness.

SUMMARY OF THE INVENTION

The process for producing semiconductor chips according to the present invention comprises the steps of:

providing a semiconductor wafer having a surface overlaid with circuits;

forming an arrangement wherein a back of the semiconductor wafer is fixed on a dicing tape and wherein a pressure sensitive adhesive double coated sheet is stuck to a circuit surface of the semiconductor wafer, this pressure sensitive adhesive double coated sheet comprising a shrinkable base having its both sides overlaid with pressure sensitive adhesive layers, at least one of these pressure sensitive adhesive layers composed of an energy radiation curable pressure sensitive adhesive;

dicing the semiconductor wafer together with the pressure sensitive adhesive double coated sheet by each circuit to thereby form semiconductor chips;

fixing the semiconductor chips on a transparent hard plate by adherence of the pressure sensitive adhesive layer of the pressure sensitive adhesive double coated sheet remote from the semiconductor chips;

stripping the dicing tape from the semiconductor chips;

irradiating the pressure sensitive adhesive double coated sheet, from the transparent hard plate side, with energy radiation;

shrinking the shrinkable base of the pressure sensitive adhesive double coated sheet; and picking the semiconductor chips up.

In the present invention, it is preferred that both the pressure sensitive adhesive layers of the pressure sensitive adhesive double coated sheet be composed of an energy radiation curable pressure sensitive adhesive. Further, in the present invention, it is preferred that, after the stripping of the dicing tape from the semiconductor chips but before the irradiating of the pressure sensitive adhesive double coated sheet, from the transparent hard plate side, with energy radiation, backs of the semiconductor chips exposed by the stripping of the dicing tape are ground.

The above present invention enables producing semiconductor chips of extremely reduced thickness in high production efficiency while minimizing the damaging thereof.

DETAILED DESCRIPTION OF THE INVENTION

The present invention will be described in greater detail below with reference to the appended drawings.

Figure 1:
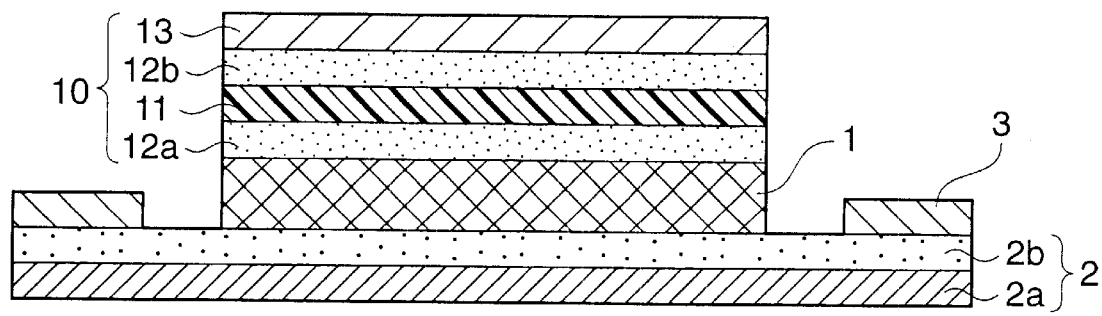
FIGS. 1 to 6 show the steps to be performed in the process for picking up semiconductor chips according to the present invention.

In the present invention, referring first to FIG. 1, semiconductor wafer 1 having a surface overlaid with circuits is provided, and a back of the semiconductor wafer is fixed on dicing tape 2. Pressure sensitive adhesive double coated sheet 10 is stuck to a circuit surface of the semiconductor wafer in order to protect the circuit surface.

Formation of circuits on a surface of a semiconductor wafer is accomplished by customary means such as the etching or the lift-off technique. After the circuit formation, the back of the semiconductor wafer may be ground so as to regulate the thickness thereof to a desirable one.

Various pressure sensitive adhesive tapes having commonly been employed in the dicing of semiconductor wafers can be used without any particular limitation as the dicing tape 2. In particular, a dicing tape comprising base 2a and, overlaid thereon, pressure sensitive adhesive layer 2b which is curable upon exposure to energy radiation (energy rays or energy beams) is preferably used in the present invention.

The periphery of the dicing tape 2 is secured to circular or rectangular ring frame 3.

The pressure sensitive adhesive double coated sheet 10 for use in the present invention, as described in detail below, comprises shrink base 11 having its both sides overlaid with pressure sensitive adhesive layers 12a, 12b. At least one of the pressure sensitive adhesive layers 12a, 12b is composed of an energy radiation curable pressure sensitive adhesive. The energy radiation curable pressure sensitive adhesive is preferably used in the side of pressure sensitive adhesive layer 12a to which the semiconductor wafer 1 is stuck. The energy radiation curable pressure sensitive adhesive layer has the property of curing upon being exposed to energy radiation with the result that the adherence to semiconductor chips is reduced.

Upper surface of the pressure sensitive adhesive layer 12b not stuck to the semiconductor wafer 1 may be overlaid with release liner 13 for protecting the pressure sensitive adhesive layer.

The arrangement of FIG. 1 can be realized through various courses including various pretreatments to be performed in the processing of semiconductors. Therefore, what courses have been taken for the realization of the above arrangement are not particularly limited in the present invention.

For example, the arrangement of FIG. 1 is realized by first sticking the dicing tape 2 to the back of one semiconductor wafer 1 and securing the periphery of the dicing tape 2 to the ring frame 3 and thereafter sticking the pressure sensitive adhesive double coated sheet 10 to the circuit surface of the semiconductor wafer 1.

Alternatively, the arrangement of FIG. 1 may be realized by first sticking the pressure sensitive adhesive double coated sheet 10 to the circuit surface of the semiconductor wafer 1 and thereafter fixing the back of one semiconductor wafer 1 on the dicing tape 2 and securing the periphery of the dicing tape 2 to the ring frame 3.

Figure 2:
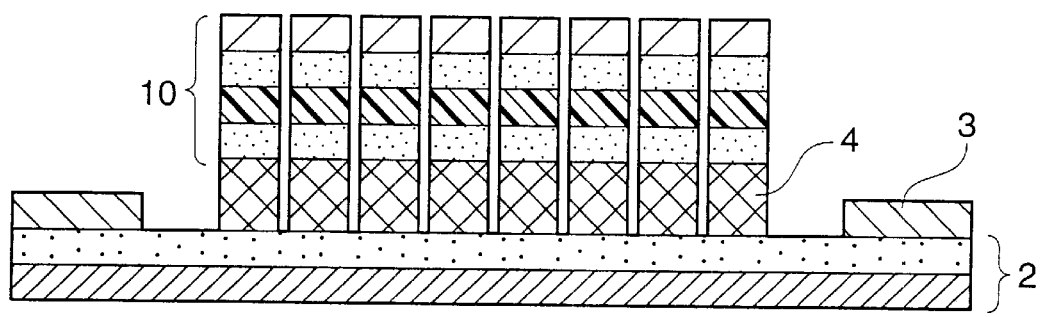

Subsequently in the present invention, referring to FIG. 2, the semiconductor wafer 1 in the state of having the pressure sensitive adhesive double coated sheet 10 stuck thereto is diced circuit by circuit to thereby form semiconductor chips 4. Thus, for facilitating the recognition of circuit pattern at the time of dicing, it is preferred that all the base 11, pressure sensitive adhesive layers 12a, 12b and release liner 13 which constitute the pressure sensitive adhesive double coated sheet 10 are transparent. Various dicing devices having commonly been employed in the art can be used in this dicing without any particular limitation.

Figure 3:
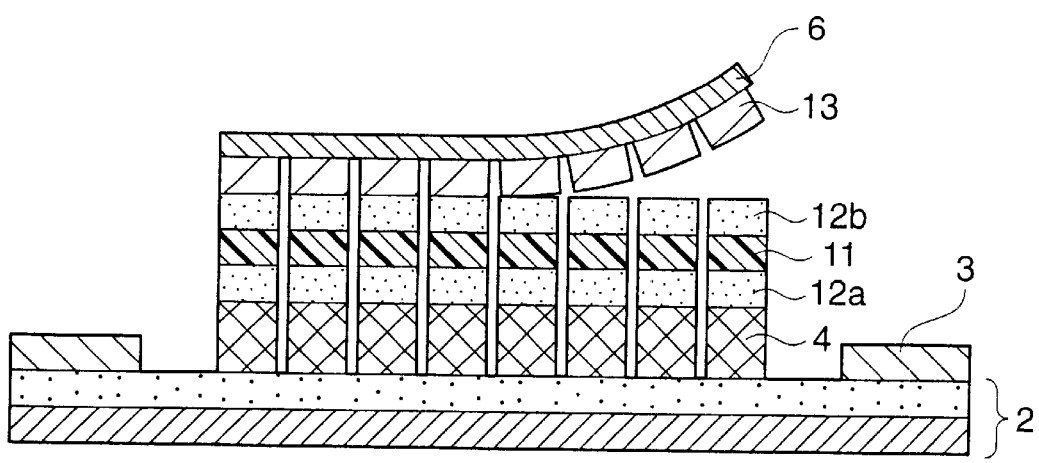
Figure 4:
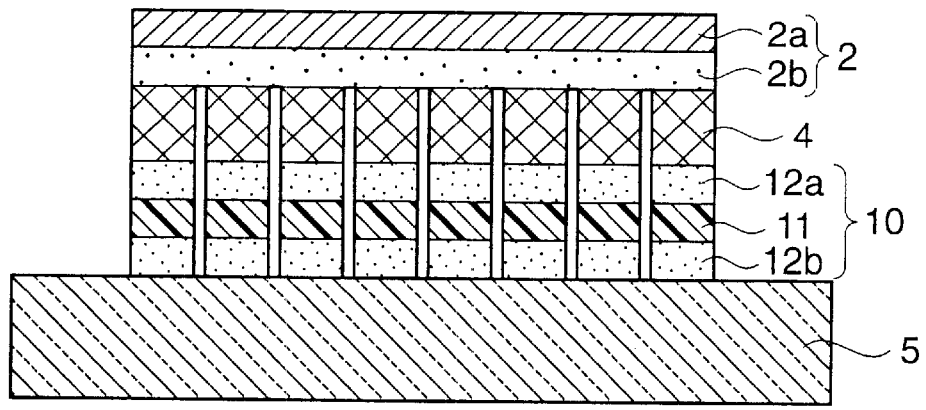

After the dicing, referring to FIG. 4, the semiconductor chips 4 are fixed on transparent hard plate 5 by adherence of the pressure sensitive adhesive layer 12b of the pressure sensitive adhesive double coated sheet 10. When the release liner 13 is stuck onto the pressure sensitive adhesive layer 12b, the release liner 13 is removed in advance to thereby expose the pressure sensitive adhesive layer 12b and thereafter the semiconductor chips 4 are fixed on the transparent hard plate 5 by means of the pressure sensitive adhesive layer 12b. The release liner 13 can be stripped from the pressure sensitive adhesive layer 12b by, for example, the method in which, referring to FIG. 3, pressure sensitive adhesive sheet 6 with a diameter larger than that of the semiconductor wafer 1 is stuck to the entire surface of the release liner 13 and thereafter a peeling strength is applied to the pressure sensitive adhesive sheet 6.

The fixing of the semiconductor chips 4 on the transparent hard plate 5 is performed while the semiconductor chips 4 are stuck to the dicing tape 2. Therefore, the alignment of the semiconductor chips is maintained. Before or after the fixing of the semiconductor chips 4 on the transparent hard plate 5, the periphery of the dicing tape 2 is preferably cut so that the diameter of the dicing tape 2 conforms to that of the semiconductor wafer. This removes the excess portion of the dicing tape 2 to thereby enable enhancing operation efficiency.

After the fixing of the semiconductor chips 4 on the transparent hard plate 5, the dicing tape 2 is stripped from the backs of the semiconductor chips 4. The stripping of the dicing tape 2 is appropriately performed in conformity with the properties of the employed tape. As in the stripping of the release liner 13, a pressure sensitive adhesive sheet may be stuck to the entire surface of the dicing tape 2, followed by peeling the pressure sensitive adhesive sheet from the dicing tape. When, in particular, the dicing tape 2 comprises energy radiation curable pressure sensitive adhesive layer 2b, the stripping off of the dicing tape 2 can be facilitated by irradiating the dicing tape 2 from its base 2a side with energy radiation to thereby reduce the adhesive strength of the energy radiation curable pressure sensitive adhesive layer 2b.

Figure 5:
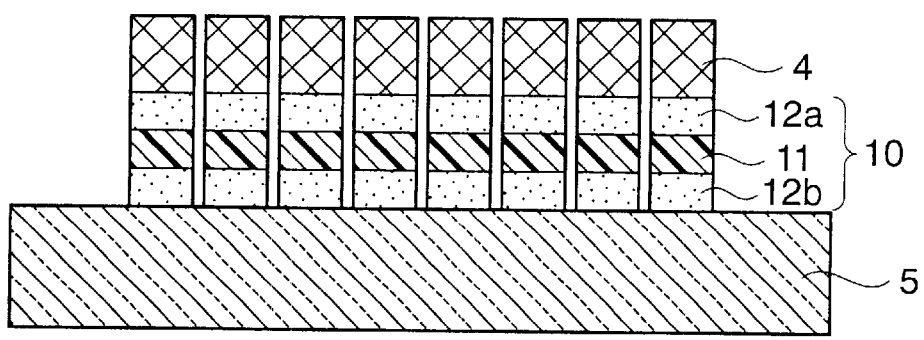

When the dicing tape 2 is stripped off, the backs of the semiconductor chips 4 are exposed as shown in FIG. 5. Thus, in this stage, the semiconductor chips 4 may further be processed according to necessity. For example, the backs of the individual semiconductor chips 4 may be ground so as to reduce the thickness of the semiconductor chips 4.

Thereafter, the pressure sensitive adhesive double coated sheet 10, from the side of transparent hard plate 5, is exposed to energy radiation. The exposing to energy radiation may be performed over the entire surface of the pressure sensitive adhesive double coated sheet 10 or on a spot basis on portions where semiconductor chips to be picked up are secured.

The energy radiation passes through the transparent hard plate 5, the pressure sensitive adhesive layer 12b and the base 11 and reaches the energy radiation curable pressure sensitive adhesive layer 12a. Accordingly, when ultraviolet radiation is used as the energy radiation, transparent pressure sensitive adhesive layer 12b and transparent base 11 are employed. The energy radiation curable pressure sensitive adhesive layer 12a is cured by the exposure to energy radiation, so that the adherence thereof is reduced or vanished to thereby enable stripping of the semiconductor chips 4.

The exposure to energy radiation is performed by common means such as an ultraviolet lamp or a high pressure mercury lamp. When portions of the pressure sensitive adhesive double coated sheet 10 are exposed to energy radiation, a condensing (converging) lens, a reflecting mirror or the like can be employed.

In the present invention, the pressure sensitive adhesive double coated sheet 10 is heated after or simultaneously with the exposure to energy radiation. The heating is performed by, for example, a hot plate or a heater. The heating may also be performed on a spot basis with the use of heat rays. The exposure to heat rays is performed on a spot basis on portions where semiconductor chips to be picked up are secured and where have been or are exposed to energy radiation.

The exposure to heat rays is performed by a halogen lamp, a xenon lamp or a high pressure mercury lamp. For spot exposure, a condensing (converging) lens or a reflecting mirror can be employed. The exposure to heat rays may be performed from the side of transparent hard plate 5 or the side of semiconductor chips 4.

When any of the above measures is employed, it is preferred that the heating be carried out so that the temperature of the pressure sensitive adhesive double coated sheet 10 is raised to especially about 100–300° C., still especially about 150–200° C.

The high pressure mercury lamp can simultaneously function as an energy radiation source and as a heat ray source. Accordingly, the spot exposure to energy radiation and heat rays can be simultaneously accomplished by the use of the high pressure mercury lamp. In the use of the high pressure mercury lamp, the exposure is performed from the side of transparent hard plate 5.

Figure 6:
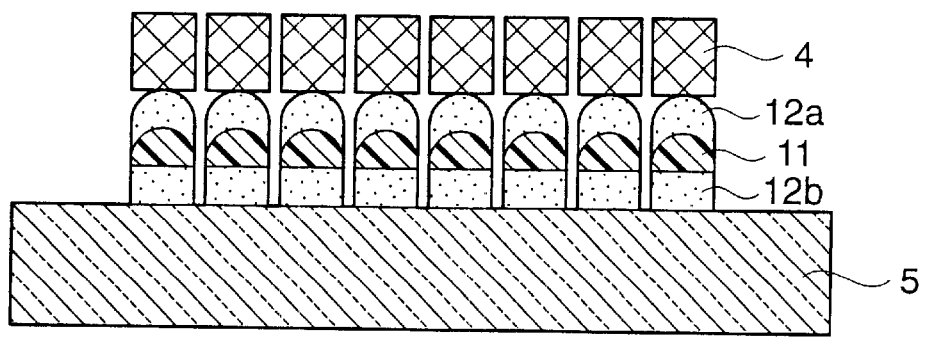

Referring now to FIG. 6, the above heating causes the pressure sensitive adhesive double coated sheet 10 to deform to thereby reduce the area of contact of the semiconductor chips 4 with the pressure sensitive adhesive layer 12a of the pressure sensitive adhesive double coated sheet 10. Thus, the pickup of the semiconductor chips 4 is facilitated. The use of the shrinkable base 11 promotes the deformation of the pressure sensitive adhesive double coated sheet 10.

As mentioned above, the heating causes the pressure sensitive adhesive double coated sheet 10 to deform to thereby reduce the area of contact of the semiconductor chips 4 with the pressure sensitive adhesive layer 12a. Furthermore, the adhesive force of the pressure sensitive adhesive layer 12a is lowered by exposure to energy radiation. As a result, the semiconductor chips 4 can be easily picked up by common means such as a suction collet. Thus, selective pickup of semiconductor chips can be effected, and operation efficiency can be enhanced.

The pressure sensitive adhesive double coated sheet 10 for use in the present invention will now be described. The pressure sensitive adhesive double coated sheet 10 comprises shrinkable base 11 having its both sides overlaid with pressure sensitive adhesive layers 12a, 12b.

The base 11, although not particularly limited as long as it is shrinkable, can be selected from among, for example, films of polyethylene, polypropylene, polybutene, polybutadiene, polymethylpentene, polyvinyl chloride, vinyl chloride copolymers, polyethylene terephthalate, polybutylene terephthalate, polyurethanes, ethylene/vinyl acetate copolymer, ionomer resins, ethylene/(meth)acrylic acid copolymer, ethylene/(meth)acrylic ester copolymers, polystyrene polycarbonate and fluororesin, films produced by crosslinking these and films composed of laminates thereof. Furthermore, according to necessity, use can be made of films produced by coloring the above films. These films may be produced by extrusion or casting. The thickness of the base is generally in the range of 5 to 300 $\mu$m, preferably 10 to 200 $\mu$m.

Of the above films, heat shrinkable films are preferably employed as the base in the present invention.

The shrinkage factor (shrinkage ratio) of the shrinkable film preferably employed in the present invention is preferably in the range of 10 to 90%, still preferably 20 to 80%.

The shrinkage factor (SF) of the shrinkable film is calculated from the dimension before shrinkage and the dimension after shrinkage by the formula:

$$SF = \frac{(\text{Dim. before shrink}) - (\text{Dim. after shrink})}{(\text{Dim. before shrink})} \times 100$$

The above shrinkage factor values are those calculated from the dimensions of film measured before and after heating at 120° C.

In particular, it is preferred that uniaxially or biaxially oriented films of polyethylene, polypropylene, polyethylene terephthalate or the like be used as the heat shrinkable film.

The shrinkable film may be a laminate of films whose shrinkage factors are different from each other. When the laminate composed of films whose shrinkage factors are different from each other is used as the base 11, a protrudent deformation is likely to occur on the lower shrinkage factor side, so that the sticking of the semiconductor chips 4 is only made by point contacts to thereby extremely facilitate the removal of the semiconductor chips 4.

In the use of the above pressure sensitive adhesive double coated sheet 10, as aforementioned, the energy radiation curable pressure sensitive adhesive layer is irradiated with energy radiation after the completion of requisite steps. When ultraviolet radiation is used as the energy radiation, all the films constituting the shrinkable base 11 must be permeable for ultraviolet rays.

The pressure sensitive adhesive double coated sheet 10 comprises the shrinkable base 11 having its both sides overlaid with pressure sensitive adhesive layers 12a, 12b, at least one (one or both) of the pressure sensitive adhesive layers composed of an energy radiation curable pressure sensitive adhesive. It is preferred that the pressure sensitive adhesive layer 12a stuck to the semiconductor wafer 1 (or semiconductor chips 4) be composed of an energy radiation curable pressure sensitive adhesive. Although it is also preferred that the other pressure sensitive adhesive layer 12b stuck to the transparent hard plate 5 be composed of an energy radiation curable pressure sensitive adhesive, this is not inevitably requisite as long as the pressure sensitive adhesive layer 12a is composed of an energy radiation curable pressure sensitive adhesive.

When both the pressure sensitive adhesive layers 12a, 12b are composed of energy radiation curable pressure sensitive adhesives, these energy radiation curable pressure sensitive adhesives are preferably selected so that the elastic modulus of pressure sensitive adhesive layer 12a having been cured (elastic modulus 12a) is higher than the elastic modulus of pressure sensitive adhesive layer 12b having been cured (elastic modulus 12b). The elastic modulus 12a is preferably at least two times the elastic modulus 12b, still preferably at least five times the elastic modulus 12b.

The above selection of the elastic moduli of pressure sensitive adhesive layers 12a, 12b having been cured promotes the thermal deformation of pressure sensitive adhesive double coated sheet 10 and facilitates the detachment of semiconductor chips 4.

The energy radiation curable pressure sensitive adhesive generally comprises an acrylic pressure sensitive adhesive and an energy radiation polymerizable compound as main components.

The acrylic pressure sensitive adhesive for use in the present invention comprises a copolymer of a monomer consisting mainly of an acrylic acid alkyl ester or a methacrylic acid alkyl ester, and increases the adherence and cohesive strength of energy radiation curable pressure sensitive adhesive before curing.

For example, low-molecular-weight compounds having in the molecule thereof at least two photopolymerizable carbon to carbon double bonds that can be converted into a three-dimensional network structure by light irradiation as disclosed in Japanese Patent Laid-open Publication Nos. 60(1985)-196,956 and 60(1985)-223,139 are widely used as the energy radiation polymerizable compounds to be incorporated in the energy radiation curable pressure sensitive adhesives. Specific examples thereof include trimethylolpropane triacrylate, pentaerythritol triacrylate, pentaerythritol tetraacrylate, dipentaery-thritol monohydroxypentaacrylate, dipentaerythritol hexaacrylate, 1,4-butylene glycol diacrylate, 1,6-hexanediol diacrylate, polyethylene glycol diacrylate and commercially available oligoester acrylates.

Furthermore, besides the above acrylate compounds, urethane acrylate oligomers can be used as the energy radiation polymerizable compounds. Urethane acrylate oligomers can be obtained by first reacting a polyester or polyether polyol compound with a polyisocyanate compound such as 2,4-tolylene diisocyanate, 2,6-tolylene diisocyanate, 1,3-xylylene diisocyanate, 1,4-xylylene diisocyanate or diphenylmethane-4,4-diisocyanate to thereby obtain an isocyanate terminated urethane prepolymer and by thereafter reacting the obtained isocyanate terminated urethane prepolymer with a hydroxyl group containing acrylate or methacrylate, for example, 2-hydroxyethyl acrylate, 2-hydroxyethyl methacrylate, 2-hydroxypropyl acrylate, 2-hydroxypropyl methacrylate, polyethylene glycol acrylate or polyethylene glycol methacrylate.

With respect to the blending ratio of the energy radiation polymerizable compound to acrylic pressure sensitive adhesive in the energy radiation curable pressure sensitive adhesive, it is preferred that 50 to 200 parts by weight of the energy radiation polymerizable compound is used per 100 parts by weight of the acrylic pressure sensitive adhesive. In this instance, the initial adhesive strength of the obtained pressure sensitive adhesive sheet is large, and the adhesive strength is sharply dropped upon irradiation of the pressure sensitive adhesive layer with energy radiation. Accordingly, the peeling at the interface of the semiconductor chips 4 and the acrylic energy radiation curable pressure sensitive adhesive layer 12a is facilitated to thereby enable picking up of the semiconductor chips 4.

The energy radiation curable pressure sensitive adhesive layer may be composed of an energy radiation curable copolymer having an energy radiation polymerizable group as a side chain. This energy radiation curable copolymer simultaneously exhibits satisfactory adherence and energy radiation curability properties. Details of the energy radiation curable copolymer having an energy radiation polymerizable group as a side chain are described in, for example, Japanese Patent Laid-open Publication Nos. 5(1993)-32946 and 8(1996)-27239.

The above acrylic energy radiation curable pressure sensitive adhesive possesses satisfactory adhesive strength to the semiconductor chips 4 before exposure to energy radiation, and the adhesive strength is extremely decreased upon exposure to energy radiation. That is, the acrylic energy radiation curable pressure sensitive adhesive enables securing the semiconductor chips 4 with satisfactory adhesive strength before exposure to energy radiation, but, after exposure to energy radiation, enables easily detaching the semiconductor chips 4 therefrom.

The other pressure sensitive adhesive layer 12b can be formed from various conventional pressure sensitive adhesives. These pressure sensitive adhesives are not limited at all. As examples thereof, there can be mentioned peelable pressure sensitive adhesives based on rubbers, acrylics, silicones, polyurethanes and polyvinyl ethers. However, in the present invention, it is preferred that the pressure sensitive adhesive layer 12b also be composed of the above energy radiation curable pressure sensitive adhesive.

Although depending on the type of material constituting the pressure sensitive adhesive layer, the thickness of each of the pressure sensitive adhesive layers 12a, 12b is generally in the range of about 3 to 100 µm, preferably about 10 to 50 µm.

Transparent resin films, for example, a film of a polyolefin such as polyethylene or polypropylene and a polyethylene terephthalate film are used as the optionally employed release liner 13.

As the transparent hard plate 5, there can be employed, for example, a glass plate, a quartz plate or a plastic plate such as a plate of acrylic, polyvinyl chloride, polyethylene terephthalate, polypropylene or polycarbonate. The hardness, defined by ASTM D 883, of the transparent hard plate 5 is preferably at least 70 MPa. The thickness of the transparent hard plate 5, although depending on the properties of the material used therein, is generally in the range of about 0.1 to 10 mm. Those which are permeable for energy radiation and heat rays for use in the present invention are used as the transparent hard plate 5.

As apparent from the foregoing, the present invention provides the process for producing semiconductor chips with high yield while minimizing the damage to semiconductor chips, even if the thickness thereof is extremely reduced, and while avoiding chip cracking on the circuit side of the semiconductor chips.

EXAMPLE

The present invention will further be illustrated below with reference to the following Examples which in no way limit the scope of the invention.

Example 1

[Production of Pressure Sensitive Adhesive Double Coated sheet]

1(1) 100 parts by weight of an acrylic pressure sensitive adhesive (copolymer of 91 parts by weight of n-butyl acrylate and 9 parts by weight of acrylic acid), 120 parts by weight of urethane acrylate oligomer (weight average molecular weight: about 10,000, produced by Dainichiseika Color And Chemicals Manufacturing Company Limited), 2 parts by weight of isocyanate crosslinking agent (trade name: Coronate L, produced by Nippon Polyurethane Co., Ltd.) and 2 parts by weight of initiator for energy radiation curing reaction (α-hydroxycyclohexyl phenyl ketone) were mixed together, thereby obtaining an energy radiation curable pressure sensitive adhesive composition (the elastic modulus thereof after ultraviolet irradiation was $1.5 \times 10^8$ Pa)

1(2) A 38 µm thick polyethylene terephthalate film having undergone a release treatment using a silicone release agent was coated with the pressure sensitive adhesive composition obtained in the step 1(1) above so that the thickness of the coating was 15 µm and heated at 100° C. for 1 min. Thus, an energy radiation curable pressure sensitive adhesive layer was formed. Thereafter, the energy radiation curable pressure sensitive adhesive layer was stuck to a heat shrink polyethylene terephthalate film (having a thickness of 25 µm and a shrinkage factor of 65% at 120° C.). Thus, there was obtained a sheet having its one side overlaid pressure sensitive adhesive layer.

1(3) Separately, a 38 µm thick polyethylene terephthalate film having undergone a release treatment using a silicone release agent was coated with a pressure sensitive adhesive composition (the elastic modulus thereof after ultraviolet irradiation was $9.0 \times 10^8$ Pa), produced in the same manner as in the step 1(1) except that 50 parts by weight of urethane acrylate oligomer (weight average molecular weight: about 1000) was employed, so that the thickness of the coating was 15 µm and heated at 100° C. for 1 min. Thus, another energy radiation curable pressure sensitive adhesive layer was formed.

1(4) The heat shrink polyethylene terephthalate film side of the sheet having its one side overlaid pressure sensitive adhesive layer, obtained in the step 1(2) above, was stuck to the pressure sensitive adhesive layer formed on the PET film in the step 1(3) above, thereby obtaining a pressure sensitive adhesive double coated sheet.

[Production of semiconductor chips]

Dicing tape (Adwill D-218, manufactured by Lintec Corporation) was stuck to an unpolished surface of a silicon wafer of 6 inch diameter and 750 μm thickness. The above produced pressure sensitive adhesive double coated sheet (pressure sensitive adhesive layer of step 1-(3)) was stuck to a specular surface of the silicon wafer. The polyethylene terephthalate film (38 μm) as a release liner remained stuck to the pressure sensitive adhesive layer of the pressure sensitive adhesive double coated sheet which was not stuck to the silicon wafer. In this arrangement, the wafer together with the pressure sensitive adhesive double coated sheet was diced into 10 mm squares by the use of dicing device (AWD-4000B, manufactured by Tokyo Seimitsu Co., Ltd.). The polyethylene terephthalate film was stripped off with the use of a pressure sensitive adhesive sheet for stripping (Adwill S-6, manufactured by Lintec Corporation). The thus exposed pressure sensitive adhesive layer (pressure sensitive adhesive layer of step 1-(1) above) was stuck to a transparent hard plate (700 μm thick glass). The dicing tape was cut so that the diameter of the dicing tape conformed with that of the wafer. The dicing tape on its base side was irradiated with ultraviolet rays by the use of ultraviolet irradiator (RAD-2000/m8, manufactured by Lintec Corporation), and the dicing tape was stripped off. The thus exposed unpolished surfaces of semiconductor chips were ground by means of back grinder (DFG-840, manufactured by Disco Corporation) so that the thickness of the semiconductor chips became 30 μm.

Thereafter, the glass side was exposed to ultraviolet rays, and the whole was allowed to stand still on a hot plate of 160° C. for 5 min. The semiconductor chips were detached from the pressure sensitive adhesive double coated sheet. The detachment was easily accomplished without damage to the chip.

Example 2

The same procedure as in Example 1 was repeated except that, without the use of the hot plate, spot exposure (output: 300 W, distance: 10 cm, and exposure time: 5 sec) was performed chip by chip by employing a xenon lamp and by condensing heat rays into a 5 mm diameter. The semiconductor chips at portions having been exposed to heat rays were detached. The detachment was easily accomplished without damage to the chip.

What is claimed is:

1. A process for producing semiconductor chips, comprising the steps of:

providing a semiconductor wafer having a surface equipped (overlaid) with circuits;

forming an arrangement wherein a back of the semiconductor wafer is fixed on a dicing tape and wherein a pressure sensitive adhesive double coated sheet is stuck to a circuit surface of the semiconductor wafer, said pressure sensitive adhesive double coated sheet comprising a shrinkable base having its both sides overlaid with pressure sensitive adhesive layers, at least one of said pressure sensitive adhesive layers composed of an energy radiation curable pressure sensitive adhesive;

dicing the semiconductor wafer together with the pressure sensitive adhesive double coated sheet by each circuit to thereby form semiconductor chips;

fixing the semiconductor chips on a transparent hard plate by adherence of the pressure sensitive adhesive layer of the pressure sensitive adhesive double coated sheet remote from the semiconductor chips;

stripping the dicing tape from the semiconductor chips;

irradiating the pressure sensitive adhesive double coated sheet, from the transparent hard plate side, with energy radiation;

shrinking the shrinkable base of the pressure sensitive adhesive double coated sheet; and picking the semiconductor chips up.

2. The process as claimed in claim 1, wherein both the pressure sensitive adhesive layers of the pressure sensitive adhesive double coated sheet are composed of an energy radiation curable pressure sensitive adhesive.

3. The process as claimed in claim 2, wherein, after the stripping of the dicing tape from the semiconductor chips but before the irradiating of the pressure sensitive adhesive double coated sheet, from the transparent hard plate side, with energy radiation, backs of the semiconductor chips exposed by the stripping of the dicing tape are ground.

4. The process as claimed in claim 2, wherein, after the stripping of the dicing tape from the semiconductor chips but before the irradiating of the pressure sensitive adhesive double coated sheet, from the transparent hard plate side, with energy radiation, backs of the semiconductor chips exposed by the stripping of the dicing tape are ground.

* * * * *

UNITED STATES PATENT AND TRADEMARK OFFICE
CERTIFICATE OF CORRECTION

PATENT NO.   : 6,436,795 B2
DATED        : August 20, 2002
INVENTOR(S)  : Hayato Noguchi et al.

It is certified that error appears in the above-identified patent and that said Letters Patent is hereby corrected as shown below:

Column 1,
Line 51, "the damage to" should read -- damage to --.

Signed and Sealed this

Twenty-first Day of January, 2003

JAMES E. ROGAN
*Director of the United States Patent and Trademark Office*